United States Patent
Lewandowski et al.

(10) Patent No.: US 6,225,551 B1
(45) Date of Patent: May 1, 2001

(54) MULTI-FACET CONCENTRATOR OF SOLAR SETUP FOR IRRADIATING THE OBJECTS PLACED IN A TARGET PLANE WITH SOLAR LIGHT

(75) Inventors: Allan A. Lewandowski, Evergreen, CO (US); Vladislav Yampolskiy, Moscow (RU); Valerie Alekseev, Moscow (RU); Valentin Son, Moscow (RU)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/478,879

(22) Filed: Jan. 7, 2000

(30) Foreign Application Priority Data

Sep. 2, 1999 (RU) ................................................ 99000028

(51) Int. Cl.[7] .................................................. H01L 31/052
(52) U.S. Cl. .......................... 136/246; 136/259; 126/689; 126/696; 359/839; 359/858; 359/850; 359/851; 359/871; 359/884
(58) Field of Search ..................................... 136/246, 259; 126/689, 696; 359/839, 858, 850, 851, 871, 884

(56) References Cited

U.S. PATENT DOCUMENTS 3,713,727 * 1/1973 Markosian et al. ................. 136/246
3,998,206 * 12/1976 Jahn ..................................... 136/246

FOREIGN PATENT DOCUMENTS

| 1-230271 | * | 9/1989 | (JP) . |
| 139513 | | 3/1961 | (SU) . |
| 1746157A1 | | 7/1992 | (SU) . |
| 1800243A1 | | 3/1993 | (SU) . |

OTHER PUBLICATIONS

Lewandowski, "The design of an Ultra–High Flux Solar Test Capability," IEEE, 1989 (month unknown).*

* cited by examiner

Primary Examiner—Alan Diamond
(74) Attorney, Agent, or Firm—Paul J. White

(57) ABSTRACT

According to the proposed invention, this technical result is achieved so that many-facet concentrator of a solar setup for exposure of objects, placed in a target plane, to the action of solar radiation containing a supporting frame and facets differing by that the facets of the concentrator are chosen with spherical focusing reflective surfaces of equal focal lengths and with selective coatings reflecting a desired spectral fraction of solar radiation, and are arranged on the supporting frame symmetrically with respect to the common axis of the concentrator, their optical axes being directed to the single point on the optical axis of the concentrator located before the nominal focus point of the concentrator and determining the position of arranging the target plane.

3 Claims, 5 Drawing Sheets

MULTI-FACET CONCENTRATOR OF SOLAR SETUP FOR IRRADIATING THE OBJECTS PLACED IN A TARGET PLANE WITH SOLAR LIGHT

CONTRACTUAL ORIGIN OF THE INVENTION

The United States Government has rights in this invention pursuant to Contract No. DE-AC36-99GO10337 between the United States Department of Energy and the Midwest Research Institute.

BACKGROUND OF THE INVENTION

1. Field of the Invention

This invention relates to solar energy technology and, in particular, to the testing of materials and articles for resistance to solar light and weather factors with the use of concentrated solar radiation.

2. Description of the Prior Art

The combined action of atmosphere and solar radiation causes irreversible changes (degradation and natural aging) in various materials and articles. The most typical and important (with respect to technical and economic factors) examples of such changes are manifested as changes in the color of construction and finishing of materials, paints and varnishes, textile dyes (known as fading or discoloration), and degradation of mechanical characteristics of polymeric materials which can be demonstrated as the effect of embrittlement and destruction of polyethylene films used in hothouses after only one or two seasons.

The rate of these and other degradation processes depends on the composition of the atmosphere, temperature, and exposition to light. The exposition to light irradiation is most pronounced in the ultraviolet (UV) region of solar spectrum (290–450 nm). The physical nature of the predominant effect of UV radiation of the Sun in material degradation processes is caused by the fact that the energy of photons of solar light in this part of spectrum corresponds to the energies of rupture of typical chemical bonds of organic and organo-element compounds (C—C; CN; C—O; C—F; C—Cl, etc.).

Irradiation of materials with the light of the long-wave (visible and infrared) regions of solar spectrum is responsible only for the heating of materials.

The above mentioned dependence of irreversible changes in coloration of coatings and materials on the exposition to sunlight is the critical factor with regard to long-run behavior of facade coatings and panels of buildings under different complex conditions of illumination inside city districts. Therefore, testing and certification of different materials and articles which are sensitive to irradiation with natural sunlight is of great practical and economic importance.

At present, the simulation of irradiation conditions, particularly the simulation of multiple concentrations of radiation in combination with a set of different atmospheric factors which affect the samples, represents a complex technical problem. This is caused by a series of physical and technical factors as follows: the spectrum of even the best specially developed metal-halogen lamps simulating natural sunlight radiation shows the pronounced linear structure, particularly in UV spectral range of interest; hence, it should be expected, that mechanisms of material degradation induced by natural sunlight, and the light of the said lamps may differ significantly; the uniformity of irradiating flux density over an entire target area should be very high (within several per cent) in order to provide good reliability of testing measurements; and to decrease the factor of excessive heating of samples under test due to absorption of visible and infrared portion of solar light it is necessary to provide special measures (in addition to possible cooling of samples), in particular, to filter off visible and infrared portion of solar radiation from a flux incident onto samples.

In the prior art, a series of concentrators have been disclosed which represent the parts of solar setups for accelerated sunlight weathering tests and using concentrated solar radiation. For example, the solar setup in USSR Inventor's Certificate 139513, IPC GO1H 17/02 discloses equipment which is intended for testing materials and includes a concentrator consisting of six flat mirrors, each 2×1.3 m in size. These mirrors are installed in pairs on three mechanically interconnected platforms. The platforms move together and one after another along two rails put on a circle path 7 m in radius. The flat unit, 2×1.3 in size, with the samples under test is located in the center of this circular path. However, high materials consumption and, consequently, large weight, complex kinematics of the Sun tracking, and impossibility to attain high concentration ratios (of the order of 100) of solar radiation are obvious disadvantages of this design.

In USSR Inventor's Certificate 1746157, IPC F24J 2/42, a parabolic trough concentrator is disclosed which is a part of solar setup described. This concentrator is composed of flat facets. However, the design of this concentrator is also characterized by complex Sun tracking and impossibility of obtaining high solar concentration ratios.

In USSR Inventor's Certificate 1800243, IPC F24J 2/42 a prototype concentrator design is disclosed which is composed of flat facets. The design of this concentrator has an important disadvantage in that an increase in concentration ratio can be achieved also only by application of complicated kinematics of rotating samples in a target plane.

In view of the foregoing, what is needed is an improved apparatus and technique which provides performance of accelerated testing, but which simulates the duration of the processes leading to the degradation in the main characteristics of materials (chromatic, mechanical, and others) and consequent loss of trade quality which occurs from several months to several years.

Additional advantages of the present invention will be set forth in part in the description that follows and in part will be obvious from the description or can be learned from practice of the invention. The advantages of the invention can be realized and obtained by the method particularly pointed out in the appended claims.

SUMMARY OF THE INVENTION

Therefore, it is an object of the present invention to provide an apparatus for the accelerated testing of materials.

It is yet another object of the invention to provide an apparatus which allows one to attain concentration ratios up to a factor of approximately 100.

It is a further object of the invention to provide a apparatus having a low variation of concentration ratio in a single device.

It is a further object of the invention to provide to provide maximal uniformity of a flux density distribution of concentrated light flux over the entire area where samples under test are arranged.

It is a further object of the invention to provide spectral characteristics of irradiating light flux as close to the UV portion of the natural sunlight spectrum of interest as possible. It is a further object of the invention to decrease the effect of excessive heating of objects under testing due to absorption of natural sunlight in its visible and infrared parts of spectrum, while observing that the share of this fraction comprises about 90% of the total flux intensity of natural sunlight.

The invention allows the achievement of required result which consists in a reduction of a time period necessary for testing the objects by a factor of up to 100 (several days instead of several months or years) with highly reliable predictability of behavior of objects under a wide variety of testing conditions due to creation of concentrated, uniform, and selective with respect to spectrum light spot in a plane wherein the samples under tests are arranged.

Briefly, to overcome the problems of the prior art methods and in accordance with the purpose of the invention, as embodied and broadly described herein, a multi-face concentrator of a solar setup for exposure of objects placed in a target plane to the action of solar radiation, is provided which comprises a supporting frame and facets differing by that the facets of the concentrator are chosen with spherical focusing reflective surfaces of equal focal lengths and with selective coatings reflecting a desired spectral fraction of solar radiation, and are arranged on the supporting frame symmetrically with respect to the common axis of the concentrator, their optical axes being directed to the single point on the optical axis of the concentrator located before the nominal focus point of the concentrator and determining the position of arranging the target plane.

BRIEF DESCRIPTION OF THE DRAWINGS

The present invention is illustrated by way of example and not limitation in the accompanying figures in which like reference numerals indicate similar elements and in which.

DETAILED DESCRIPTION OF THE INVENTION

Unless specifically defined otherwise, all technical or scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

Figure 1:
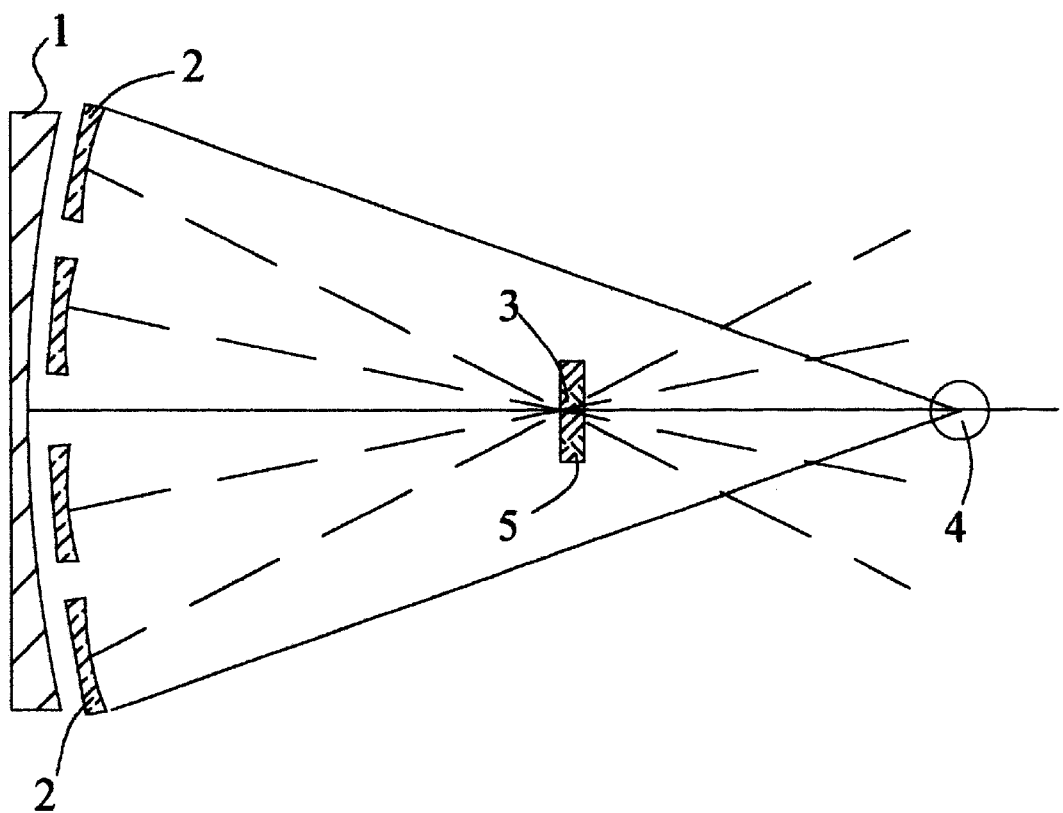
FIG. 1 shows the block diagram demonstrating the formation of uniform flux irradiating the samples in the target plane.
Figure 2:
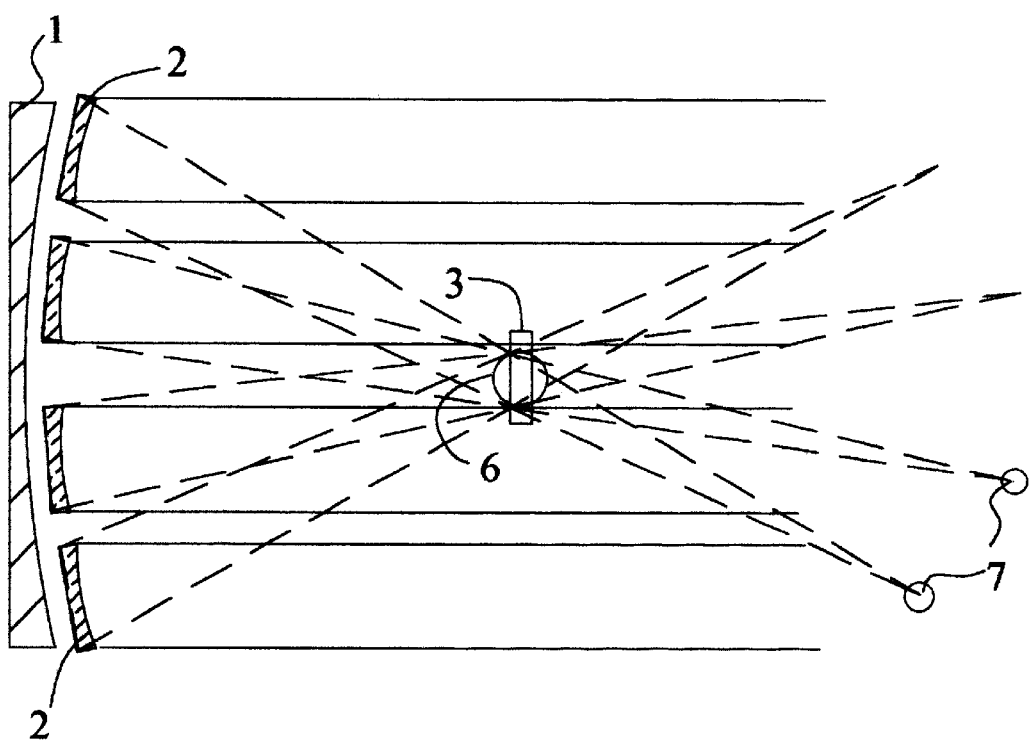
FIG. 2 shows the optical scheme demonstrating the formation of uniform flux irradiating the samples in the target plane.

Referring now to the drawing figures it is show generally in FIGS. 1 and 2, wherein like numerals represent like elements, the proposed concentrator. The concentrator contains a carrying frame 1, whereon facets 2, such as a K-8 5 grade glass substrate, are placed symmetrically with respect to the common optical axis. In this case, the optical axes of the facets are directed to a common point 3 located on an optical axis of the concentrator and disposed before nominal focal point 4 of the concentrator. The position of target plane 5, where the common area 6 is located, being determined by point 3. The common point 3 is disposed before the nominal focal point 4, to achieve less than maximal concentration, and at a fraction of the nominal facet focal length 7 so as to retain an image with approximately the same shape as the facet 2, but with smaller size in proportion to the ratio of distance 3 to distance 4. This aiming strategy and concentrator design provides a means to vary the concentration by changing the distance of common point 3 without any changes to the concentrator except reaming the facets. It is the overlapping of essentially equal and uniform facet images that create the uniform flux intensity on the object to be exposed.

The concentrator operates in a following mode. The incident radiation corresponding to the whole solar spectrum comes to facets 2 having selective reflective coatings with predetermined characteristics. The fraction of radiation reflected from facets 2 with selective coating is directed to target plane 5. In this case, all the facets are adjusted so that the light spot with high uniformity degree of illumination is collected onto a common area 6 (FIG. 2) in a target plane 5. In this case, it is possible to achieve the reduction of a time period for testing objects by 100 times depending 5 on specific requirements to the concentrator of solar radiation.

As follows from the above said, the proposed technical decision has a series of advantages as compared to the known designs, namely: (1) it provides the required high concentration ratios (up to a factor of 100); and (2) application of selective reflective coatings deposited on glass facet substrates makes it possible, on one hand, to provide high uniform reflectivity (at a level of p=0.93–0.95) in UV part of solar spectrum in the range of 290–450 nm, and, on the other hand, effective filtering off solar radiation in visible and infrared spectral region (reflectance of the selective coating in the long-wave spectral region, $p \leq 0.05$ at $\lambda \geq 650$ nm); thus, solar long-wave radiation incident to the facets is to the most part transmitted through the coating and glass facet substrate and does not hit the samples under testing.

EXAMPLE

The present example relates to the realization of the invention.

Figure 3:
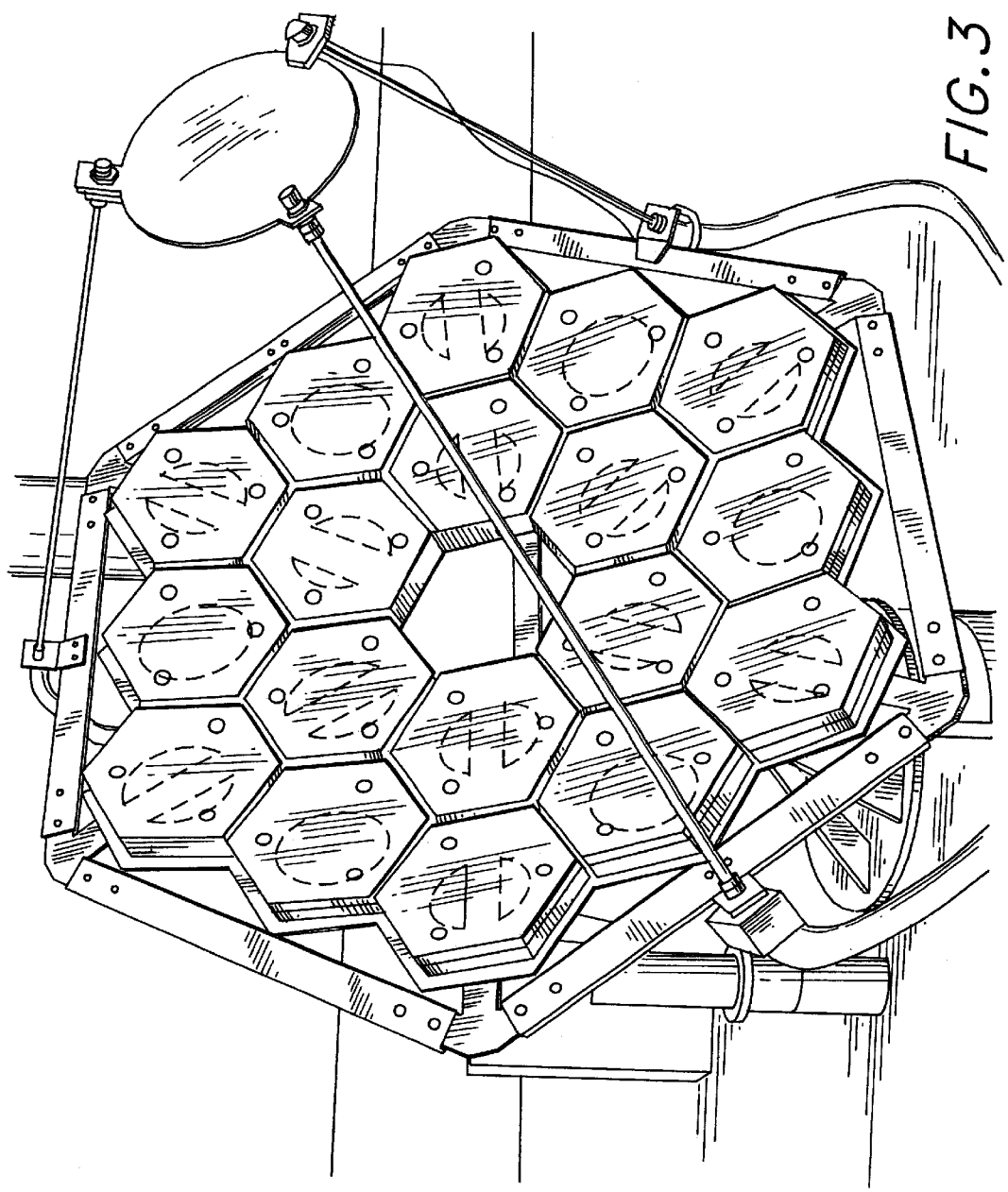
FIG. 3 shows the photo of the experimental setup with the multi-facet selective concentrator intended for accelerated natural sunlight weathering of materials.

FIG. 3 shows the photo of the experimental setup with the multi-facet selective concentrator intended for accelerated natural sunlight weathering of materials.

Figure 4:
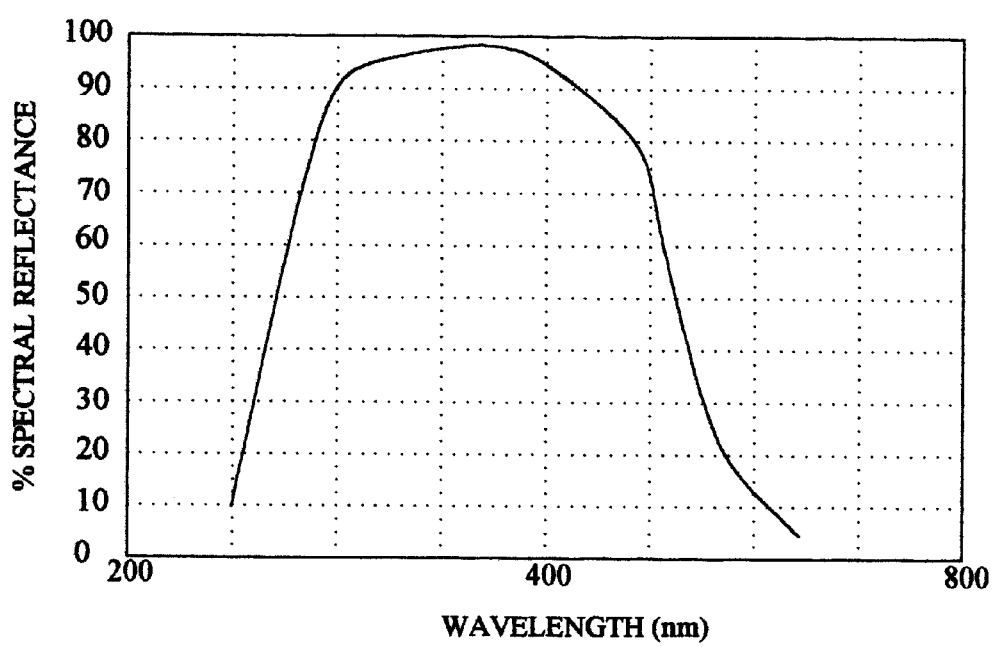
FIG. 4 demonstrates experimental data on reflective characteristics of the concentrator facets.
Figure 5:
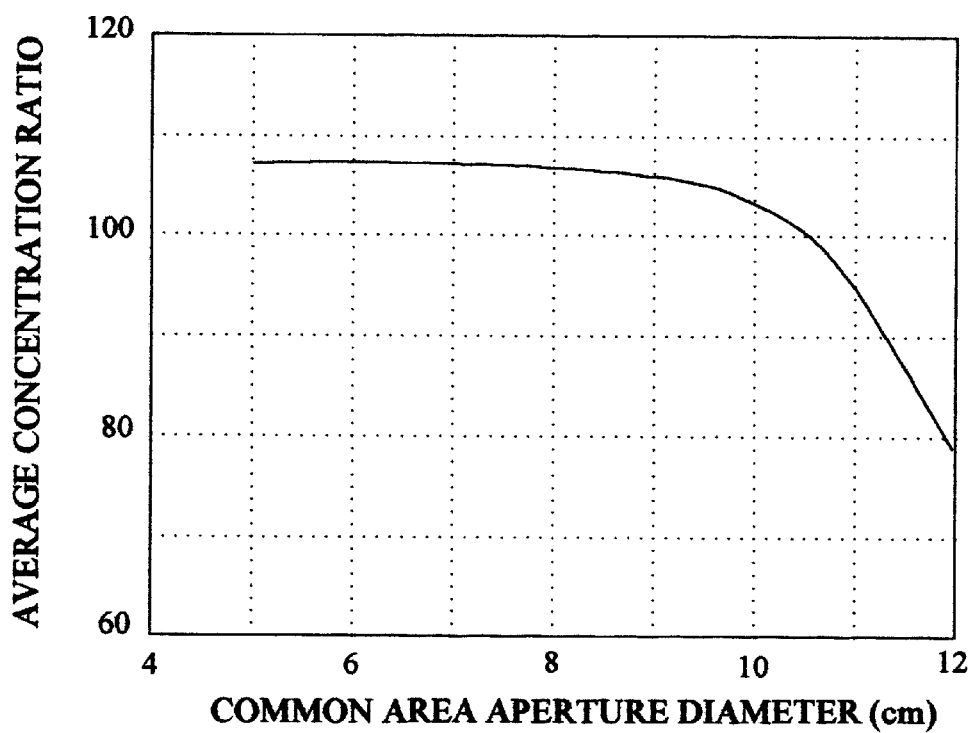
FIG. 5 demonstrates experimental data on distribution of flux power over a target area.

FIGS. 4 and 5 demonstrate experimental data on reflective characteristics of the concentrator facets and distribution of flux power over a target area, respectively.

While the present invention has been described and illustrated in detail, it is clearly understood that the same is by way of illustration and example only and is not to be taken by way of limitation, the spirit and scope of the present invention being limited only by the terms of the appended claims. For example, the present invention can be also effectively used in a series of other applications such as the part of solar setups for waste waters detoxification, disinfecting and purification of water, laser pumping with natural sunlight radiation, targeted photo and photocatalytic synthesis of chemicals using sunlight energy, and photovoltaic power systems using concentrated solar radiation.

We claim:

1. A multi-facet concentrator of a solar setup for the exposure of objects placed in a target plane to the action of solar radiation comprising;
   (a) a supporting frame, and
   (b) a plurality of facets each having an optical axis and a nominal focal point, the facets chosen with a plurality of spherical focusing reflective surfaces of equal focal lengths and with selective coatings reflecting a spectral fraction of solar radiation, and arranged on the supporting frame symmetrically with respect to a common axis of the concentrator, the optical axes of the facets being directed to a single point on the optical axis of the concentrator for determining the location of the target plane, the single point located before a nominal focus point of the concentrator and the nominal focal point of the facets for providing a uniform flux at the target plane.

2. The multi-facet concentrator of claim 1 wherein the facets comprise a glass substrate.

3. The multi-facet concentrator of claim 2 wherein the reflective coating is transmissible to visible and infrared light and reflective to ultraviolet light.

* * * * *